United States Patent [19]
Kato

[11] Patent Number: 5,621,234
[45] Date of Patent: Apr. 15, 1997

[54] VERTICAL SEMICONDUCTOR DEVICE WITH BREAKDOWN VOLTAGE IMPROVEMENT REGION

[75] Inventor: Naohito Kato, Kariya, Japan

[73] Assignee: Niipondenso Co., Ltd., Kariya, Japan

[21] Appl. No.: 237,413

[22] Filed: May 3, 1994

Related U.S. Application Data

[63] Continuation of Ser. No. 957,183, Oct. 7, 1992, abandoned.

[30] Foreign Application Priority Data

Oct. 7, 1991 [JP] Japan ................................. 3-259346

[51] Int. Cl.$^6$ .................................................. H01L 29/78
[52] U.S. Cl. ......................... 257/339; 257/328; 257/341; 257/342
[58] Field of Search ..................... 257/339, 341, 257/328, 342

[56] References Cited

U.S. PATENT DOCUMENTS

| | | | |
|---|---|---|---|
| 4,561,003 | 12/1985 | Tihanyi et al. | 257/341 |
| 4,823,176 | 4/1989 | Baliga et al. | 257/341 |

FOREIGN PATENT DOCUMENTS

| | | |
|---|---|---|
| 091079 | 10/1983 | European Pat. Off. . |
| 118336 | 9/1984 | European Pat. Off. . |
| 2641417 | 7/1990 | France . |
| 63-164473 | 7/1988 | Japan . |
| 1-39069 | 2/1989 | Japan ................................. 257/339 |
| 1207976 | 8/1989 | Japan ................................. 257/339 |
| 2275675 | 11/1990 | Japan . |

OTHER PUBLICATIONS

Abstract of Japanese Application 60-29515, Dec. 1987.
English Abstract of Japanese Application 88-282702, Aug. 1990.

*Primary Examiner*—Jerome Jackson, Jr.
*Attorney, Agent, or Firm*—Cushman, Darby & Cushman IP Group of Pillsbury Madison & Sutro LLP

[57] ABSTRACT

This invention aims at suppressing a parasitic transistor operation of a vertical MOS device at the time of application of a noise current and improving the limitations of withstanding against destruction of the device. P base layers 3 constituting each unit cell of an n-channel DMOS device are partially connected by p extraction regions between the unit cells so as to short-circuit the p base layers to source electrodes 9 in regions Z2 through the extraction regions. Accordingly, an applied noise branches to a conventional path extending from a region Z1 to the source electrodes 9 through an n source layer 5 and a path extending from +regions Z2 to the source electrodes 9 through the p extraction regions 4. Since the p regions form one continuous region throughout the device as a whole, a local potential rise of the p base layer can be limited. Accordingly, the parasitic transistor operation can be suppressed and a breakdown voltage of the device can be improved.

12 Claims, 16 Drawing Sheets

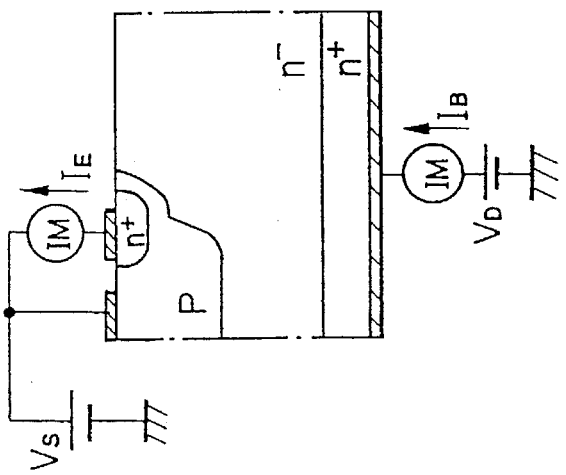
Fig. 10(c) MODEL C
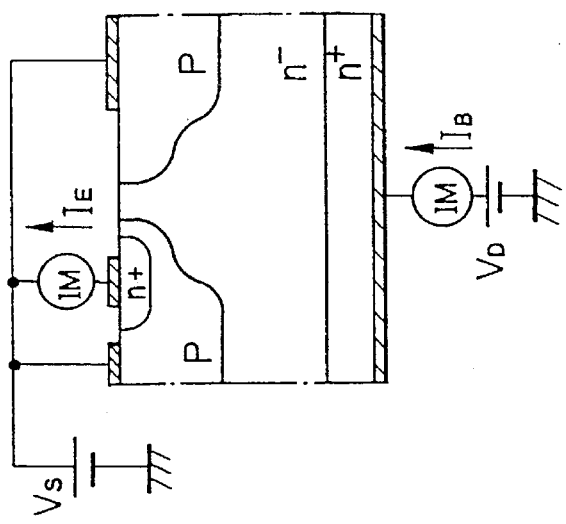
Fig. 10(b) MODEL B
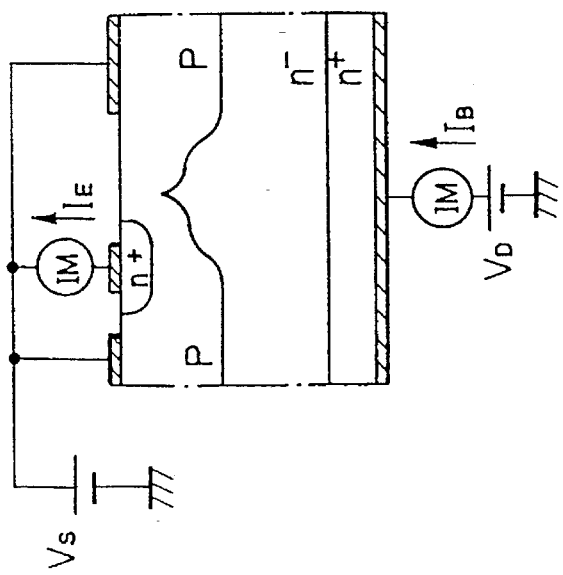
Fig. 10(a) MODEL A

UNIT CELL

VERTICAL SEMICONDUCTOR DEVICE WITH BREAKDOWN VOLTAGE IMPROVEMENT REGION

This is a continuation of application Ser. No. 07/957,183, filed on Oct. 7, 1992, which was abandoned upon the filing hereof.

BACKGROUND OF THE INVENTION

1. Field of the Invention

This invention relates to a vertical semiconductor device used as a power semiconductor device. More particularly, it relates to MOS device having improved breakdown characteristics.

2. Description of the Related Art

Double diffusion type MOS transistors (hereinafter referred to merely as "DMOS") have been proposed in the past as power semiconductor devices.

An n-channel type DMOS device, for example, has a basic structure such as shown in FIG. 13. FIG. 13(a) is a schematic plane view of principal portions of the device and FIG. 13(b) is a sectional view taken along a line 13(b)—13(b) in FIG. 13(a). Like reference numerals are used to identify like constituent members in these drawings.

The DMOS device uses the structure shown in FIG. 13(b) as a unit cell, and is a device which controls a current flowing through a drain terminal D to a source terminal S disposed on both sides of a chip by a potential applied to a gate terminal G. When a potential exceeding a threshold value is applied to a gate electrode 27 relative to a source electrode 29, a surface of a p base layer 23 (channel) below the gate electrode 27 undergoes inversion, and becomes conductive with the drain side by the source electrode 29 through an $n^+$ source layer 25 and the channel. When the device is turned OFF, a pn junction formed by the p base layer 23 and an $n^-$ drain layer 22 enters a reverse bias state and possesses a withstand voltage which is determined by the thickness and an impurity concentration of the $n^-$ drain layer 22 as a drift region.

A parasitic npn bipolar transistor exists in this DMOS transistor. An electrical equivalent circuit corresponding to FIG. 13(b) is shown in FIG. 14, where $R_D$ is a diffusion resistance inside the p base layer 23 immediately below the $n^+$ source layer 25, $C_1$ is a junction capacitance between the $n^-$ drain layer 22 and the p base layer 23, $C_2$ is a parasitic capacitance between the gate electrode 27 and the $n^-$ drain layer 22, and $C_3$ is a parasitic capacitance between the gate electrode 27 and the p base layer 23. In other words, the structure constitutes a parasitic npn transistor having the $n^+$ source layer 25 as its emitter, the p base layer as its base and the n drain layers 21, 22 as its collector.

When a voltage pulse such as a noise signal is applied across the drain electrode 30 and the source electrode 29, the noise current $I_B$ flows into the p base layer 23 through the junction capacitance $C_1$ between the $n^-$ drain layer 22 and the p base layer 23, the parasitic capacitance $C_2$ between the gate electrode 27 and the $n^-$ drain layer 22 and the parasitic capacitance $C_3$ between the gate electrode 27 and the p base layer 23, and reaches a source contact window region ZZ1 while flowing through a portion immediately below the $n^+$ source layer 25. In this instance, a potential of a vicinity portion ZZ2 of the p base layer 23 and the $n^-$ drain layer 22 becomes higher by a potential $V_B$ expressed by the following equation (1) due to the diffusion resistance $R_D$ inside the p base layer 23:

$$V_B = I_B \times R_D \qquad (1)$$

When this $V_B$ becomes greater than a forward voltage of the pn junction formed by the $n^+$ source layer 25 and the p base layer 23, the noise current $I_B$ flowing into the p base layer 23 at the vicinity portion ZZ2 of the p base layer and the $n^-$ drain layer flows as such into the $n^+$ source layer 25 and becomes a base current of a parasitic transistor. Then, this parasitic transistor enters the ON state. In an insulated gate bipolar transistor (IGBT), the operation of the parasitic transistor results in latchup of an internal thyristor.

When a current flows through the parasitic transistor, the temperature of this parasitic transistor rises. In a bipolar transistor, the temperature rise of the device itself reduces its resistance value, so that positive feedback operates in a direction which increases the current. Therefore, currents flowing through other portions of the chip concentrate on one position of the activated parasitic transistor. In other words, a so-called "hot spot" occurs and eventually, the semiconductor device is destroyed. Normally, the device is constituted by the use of a plurality of unit cells shown in FIG. 13(b) and in this case, the operation of the parasitic transistor occurs locally in most cases. In such cases, noise energy concentrates on such a local portion and destroys the device without waiting for positive feedback by heat. To overcome the limitations resulting from such destruction, the operation of this parasitic transistor must be suppressed.

In a prior art insulated gate bipolar transistor (IGBT), a structure equipped with independent extraction layers shown in FIG. 15(a), for example, has been proposed in order to improve latchup resistance at the time of turn-ON of the gate (KOKAI (Japanese Unexamined Patent Publication) No. 63-164473).

Generally, vertical MOS gate device consists of a plurality of unit cells as described above, and the structure shown in FIG. 15(a) can be expressed by an equivalent circuit diagram shown in FIG. 15(b). This circuit arrangement suppresses the rise of the base potential of the parasitic transistor by branching a part of the current flowing through each unit cell to the extraction layer. However, since the parasitic transistor in each unit cell is mutually independent of other such parasitic transistors, there remains the problem that when the parasitic operation occurs, this operation becomes a local operation as described above and the device undergoes destruction even when the amount of energy involved is small.

SUMMARY OF THE INVENTION

It is therefore a main object of the present invention to provide a vertical semiconductor device which can suppress a parasitic transistor operation and can overcome the aforementioned tendencies resulting in destruction.

To accomplish the object described above, a vertical semiconductor device according to the present invention employs the structure of a vertical device having an insulated gate, wherein extraction regions are formed having the same conductivity type as base layers connected electrically to source electrodes, and a part of the extraction regions is allowed to contact a part of the base layers.

More specifically, the present invention employs technical means of a vertical semiconductor device, which comprises a semiconductor substrate equipped with a drift region of a first conductivity type on one of the main plane sides thereof; a plurality of base layers of a second conductivity type formed inside a plurality of regions in the drift region, each constituting a unit cell; source layers each formed inside each of the regions of a plurality of base layers; gate electrodes each formed on a channel region formed between the source layer and the drift region and inside each of the base layer, through a gate insulation film; source electrodes each connected electrically to each of the source and base layers; and a drain electrode disposed on the other main plane side of the semiconductor substrate; wherein a plurality of the base layers are partially connected in such a manner as to form one continuous region, and extraction regions having the same conductivity type as the base layer are disposed therein and connected to the source electrodes.

A noise signal applied to the semiconductor device is extracted from the extraction regions to the source electrodes. Therefore, it is possible to prevent a pn junction formed between the base layer and the source layer from becoming conductive, and to improve a breakdown voltage of the semiconductor device itself.

Furthermore, in the vertical semiconductor device according to the present invention, a continuous diffusion region is formed by the base layer and the extraction region and the potential of the base layer and source potential are directly short-circuited by the extraction region as shown in FIGS. 16(a) and (b) illustrating the case of a MOSFET and an IGBT, respectively. Accordingly, the device's capacity to suppress the parasitic operation is high. The base of the parasitic transistor inside each unit cell is connected to others by the continuous diffusion layer, and the local rise of the base layer potential when viewed from the device as a whole is suppressed. This suppresses the local parasitic operation and reduces energy which otherwise results in breakdown.

It can be understood from the description given above that the present invention can remarkably improve not only the maximum current value occuring in the IBGT before it exhibits significant latchup phenomena but it can also improve the device's ability to withstand limitations of destruction of vertical MOS gate devices inclusive of MOSFETs.

BRIEF DESCRIPTION OF THE DRAWINGS

FIGS. 10(a), 10(b) and 10(c) are circuit diagrams each showing a structure of a model used for simulation of the advantages effects of the present invention;

DESCRIPTION OF THE PREFERRED EMBODIMENT

Hereinafter, a preferred embodiment of the present invention will be explained with reference to the accompanying drawings.

Figure 1A:
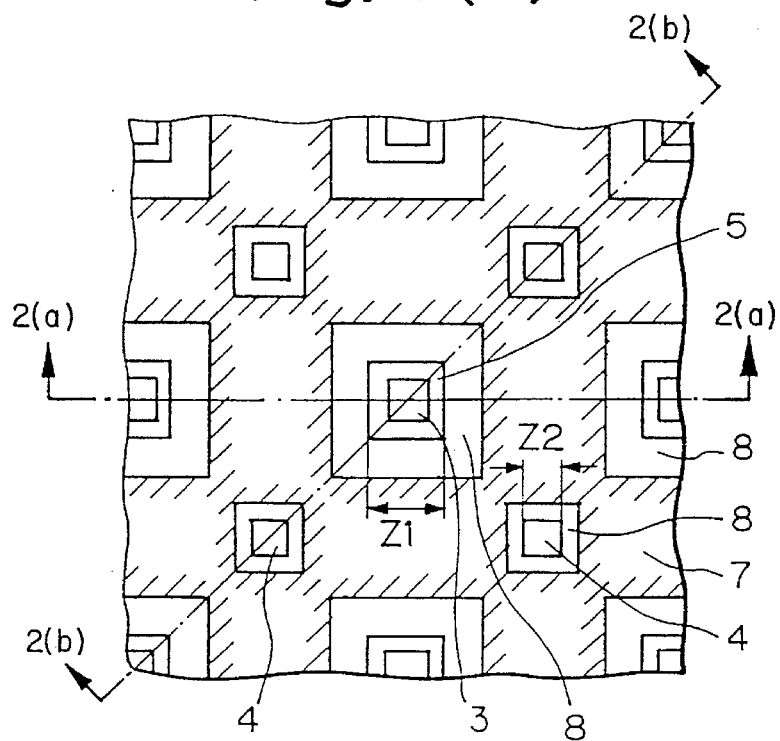
FIG. 1(a) is a plane view showing a surface pattern of principal portions of a first embodiment of the present invention.
Figure 1B:
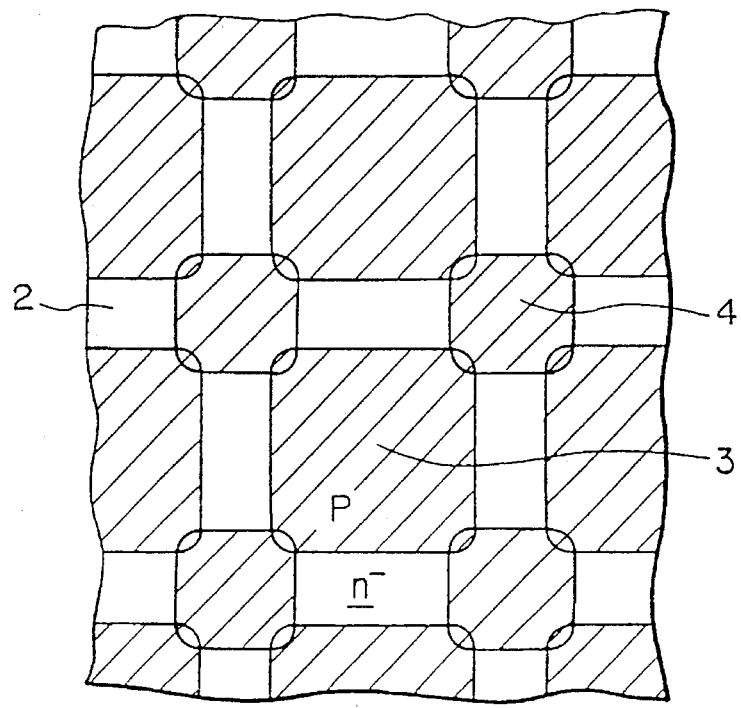
FIG. 1(b) is a plane view showing a continuous p region of FIG. 1(a)
Figure 2A:
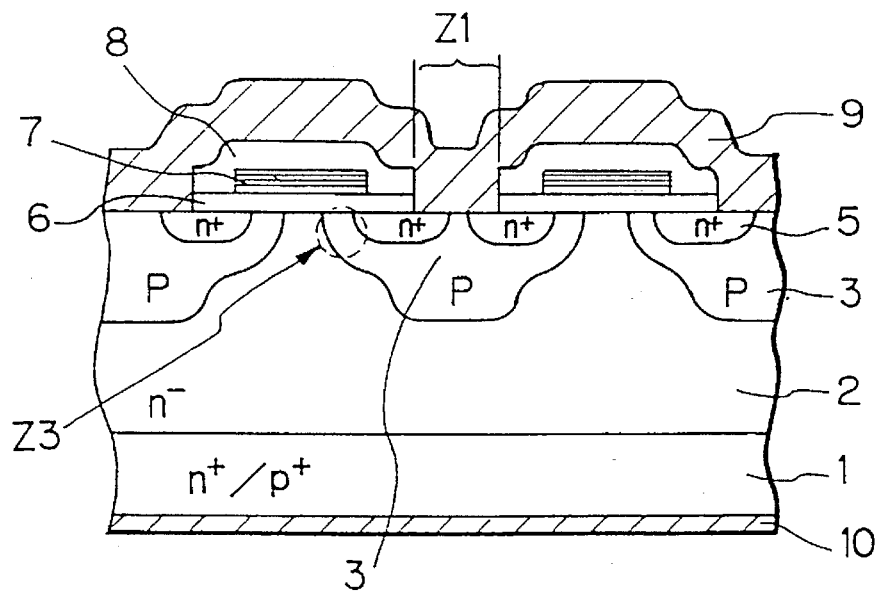
FIG. 2(a) is a sectional view taken along a line 2(a)—2(a) of FIG. 1(a)
Figure 2B:
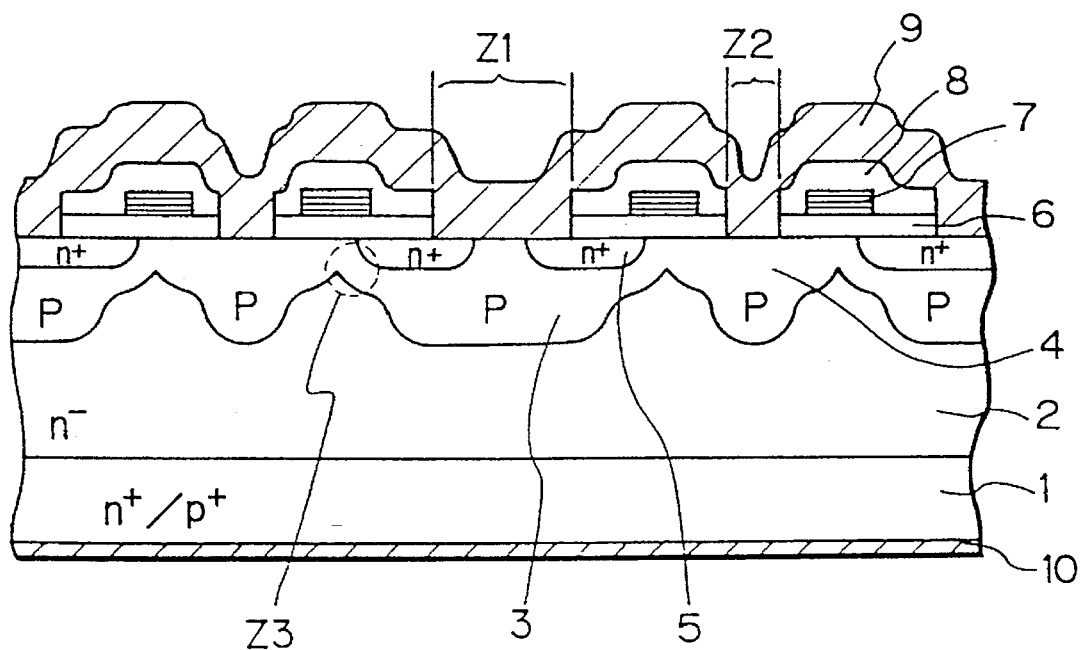
FIG. 2(b) is a sectional view taken along a line 2(b)—2(b) of FIG. 1(b)

FIGS. 1 and 2 show an n-channel DMOS according to the first embodiment of the present invention. FIG. 1(a) is its plan view, FIG. 2(a) is a sectional view taken along a line 2(a)—2(a) in FIG. 1(a), and FIG. 2(b) is a sectional view taken along a line 2(b)—2(b) in FIG. 1(a). FIG. 1(b) is a plan view showing p-type semiconductor diffusion regions corresponding to the surface pattern shown in FIG. 1(a). Throughout these drawings, like reference numerals will be used to identify like constituent elements.

In the DMOS structure of this embodiment, a high concentration $n^+$ drain layer 1, an $n^-$ drain layer 2 having a relatively low concentration as a drift region, a p base layer 3 on the main plane side of the $n^-$ drain layer 2 and an $n^+$ source layer 5 inside the p base layer 3 are disposed inside a silicon substrate in the side direction of a unit cell as shown in FIG. 2(a). A gate electrode 7 is formed on the main plane side of the silicon substrate through a gate oxide film 6. An inter-level insulating film 8 is formed on the gate electrode 7, and a source electrode 9 is connected electrically to the p base layer 3 and to the $n^+$ source layer 5 at a window Z1 on the this inter-level insulating film 8. On the other hand, a drain electrode 10 is formed on the other plane of the silicon substrate.

As shown in FIG. 2(b), a p extraction layer 4, which has the same conductivity type as the p base layer 3 and which is connected electrically to the source electrode 9 through a window Z2, is formed in a corner direction of the cell. This p extraction layer is connected partially to the p base layer 3 so that the p base layers 3 can be connected continuously with one another by the extraction layers 4 between a plurality of unit cells. In the case of the square unit cells shown in FIG. 1(a), for example, the grid-like continuous p semiconductor regions are formed by the p extraction layers 4 and the individual base layers 3 as shown in FIG. 1(b).

Next, this embodiment will be explained in the sequence of fabrication steps with reference to FIGS. 3 to 9. In these drawings, (a) is a sectional view of the section 2(a—2(a) in FIG. 1(a) and (b) is a sectional view of the section 2(b)—2(b) in FIG. 1(a), respectively.

Figure 3A:
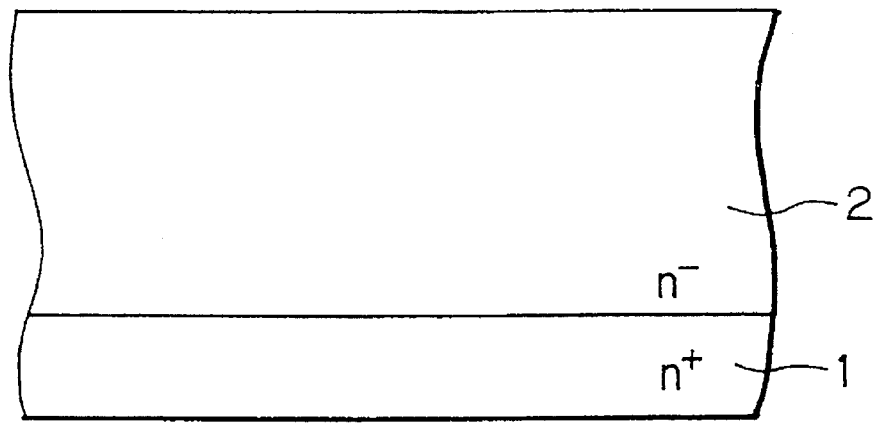
FIGS. 3(a) and 3(b) are sectional views useful for explaining a fabrication process in the first embodiment of the present invention.
Figure 3B:
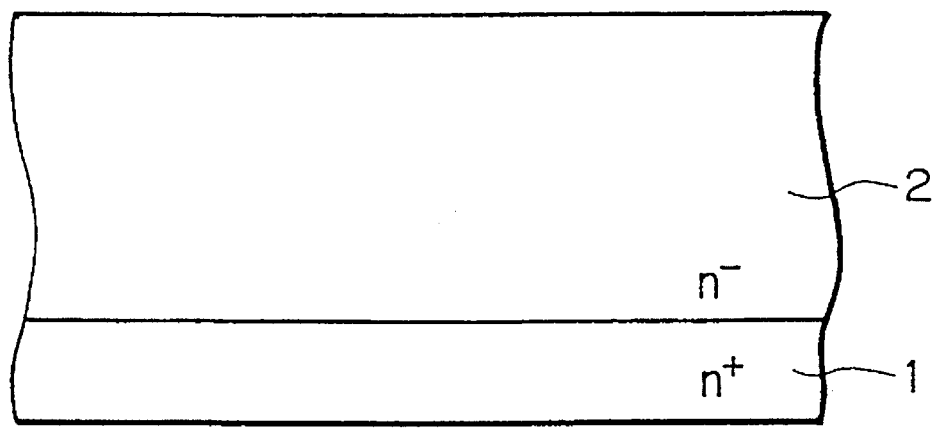
Figure 4:
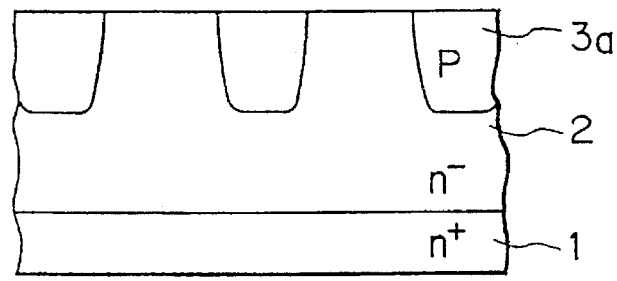
FIGS. 4(a) and 4(b) are sectional views useful for explaining fabrication process of the first embodiment.
FIG. 4(c) is a mask pattern.
Figure 4:
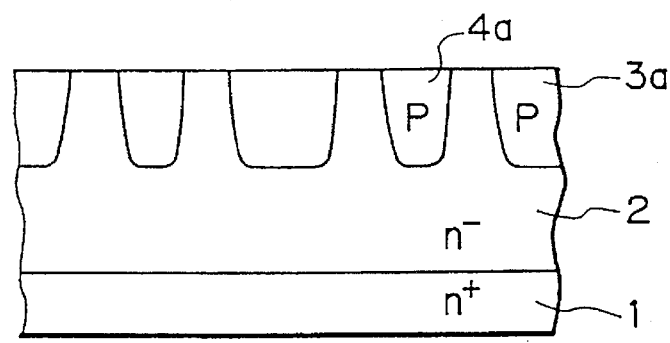
Figure 4:
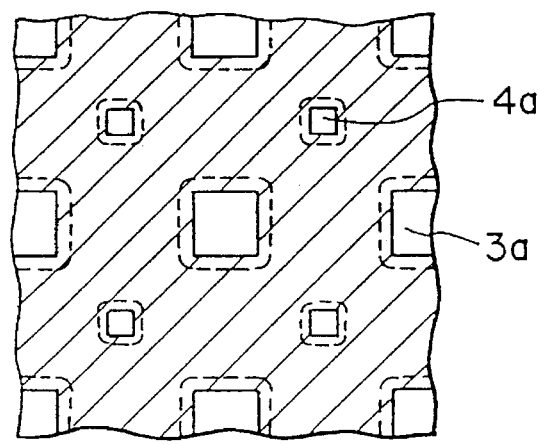

To begin with, an n silicon substrate is prepared as shown in FIGS. 3(A) and (b), and an n⁻ layer is grown on one of the main plane sides by epitaxy. These n⁺ and n⁻ layers 1 and 2 together constitute the drain of the n channel DMOS.

Next, as shown in FIGS. 4(a) and (b), a p-type impurity is introduced into positions at which the p base layers are to be formed and into positions at which the p extraction layers are to be formed, using the mask pattern shown in FIG. 4(c), to thereby form deep p well layers 3a and 4a on the surface of the n⁻ drain layer 2. At this time, a p layer for shielding is simultaneously formed in a pad region, not shown in the drawings.

Figure 5A:
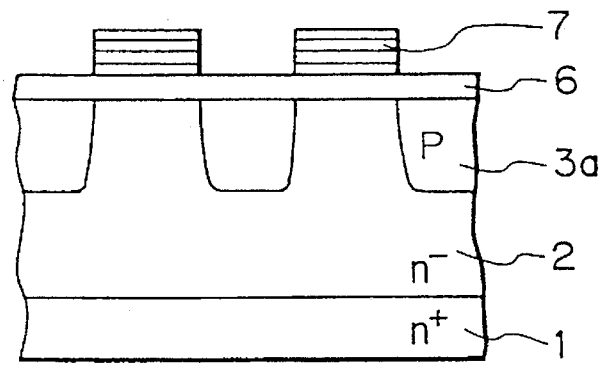
FIGS. 5(a) and 5(b) are sectional views useful for explaining the fabrication process of the first embodiment.
Figure 5B:
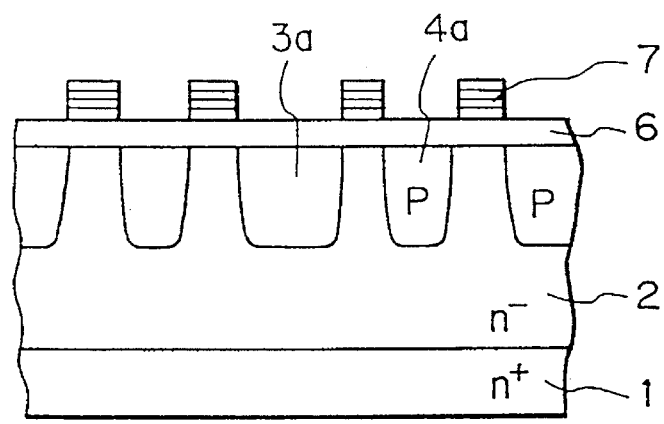
Figure 5C:
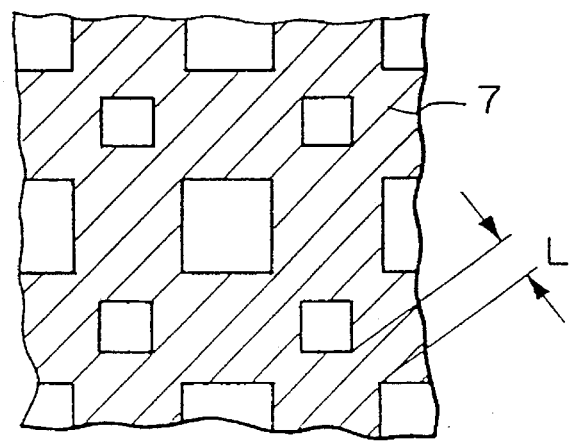
FIG. 5(c) is a planar view of the first embodiment.
Figure 6:
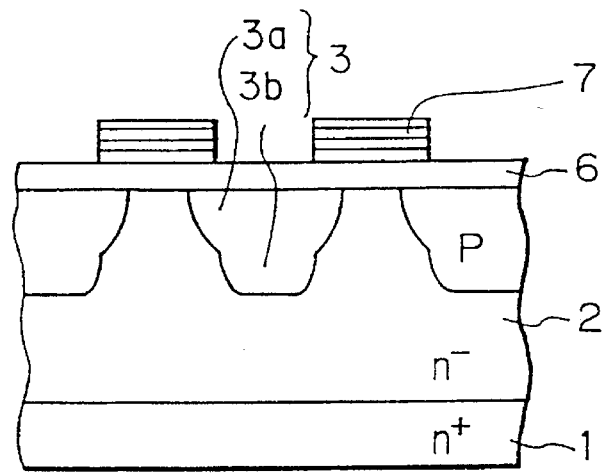
FIGS. 6(a) and 6(b) are sectional views useful for explaining the fabrication process of the first embodiment.
Figure 6:
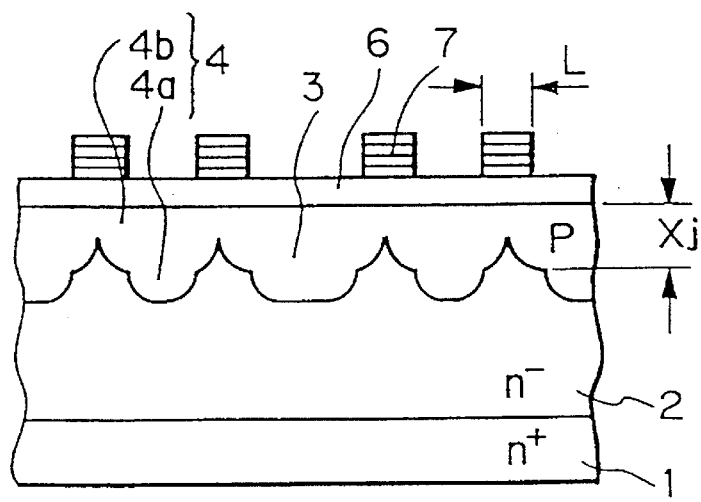

Next, the wafer surface is oxidized by for example, thermal oxidation, and is converted to the gate oxide film 6, and a polysilicon film is deposited on the gate oxide film 6 by a known method such as LPCVD. The polysilicon film is then etched by known photolithography techniques in such a manner as to bore windows for exposing the p well layers 3a and 4a and to form the gate electrode 7 as shown in FIGS. 5(a) to (c).

A p-type impurity is then doped into the entire wafer surface using the gate electrode 7 as the mask to form relatively shallow channel p layer 3b and extraction layer 4b as shown in FIGS. 6(a) and (b). In this instance, the p layers 3a and 3b form the p base layer 3, and the p layers 4a and 4b form the p extraction region 4. If the dimension L of the gate electrode shown in FIGS. 5(c) and 6(b) and the diffusion depth Xj of the shallow p layer satisfy the following relation at this time, the p base layer 3 continues the p extraction layer 4 and together form a grid-like continuous semiconductor region below the gate electrode 7 (see FIG. 1(b)):

$$L \leq 2 \times R \times Xj \qquad (2)$$

where R is a lateral diffusion ratio=0.85

Figure 7A:
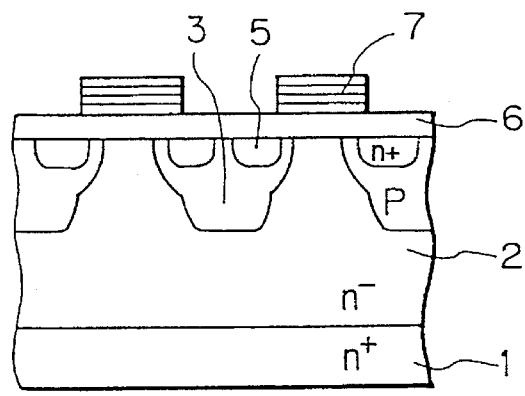
FIGS. 7(a) and 7(b) are sectional views useful for explaining the fabrication process of the first embodiment.
Figure 7B:
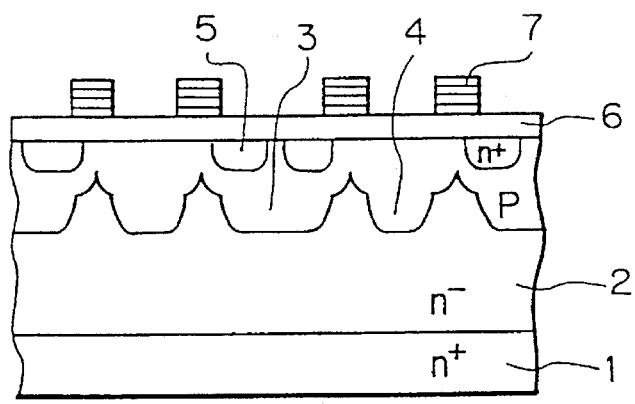
Figure 7C:
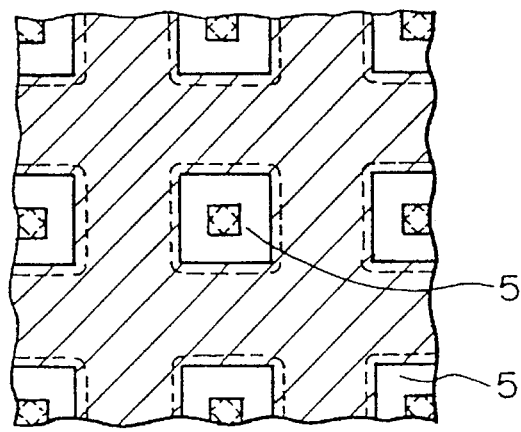
FIG. 7(c) is a mask pattern.

Next, a resist pattern (see FIG. 7(c)) having windows along the gate electrodes 7 inside the p base layer 3 forming the unit cell is formed, and P ion implantation is carried out to form the n⁺ source layer 5 using the resist film and the gate electrode 7 as the mask. After the resist film is peeled, drive-in is effected (see FIGS. 7(a) and (b)). Here, the resist film that should be left on the gate electrode 7 should be of sufficient dimensions to bury at least the windows of the gate electrodes 7 to the p extraction region 4. Therefore, the resist film may be etched to a width smaller than the line width of the gate electrode 7.

Figure 8A:
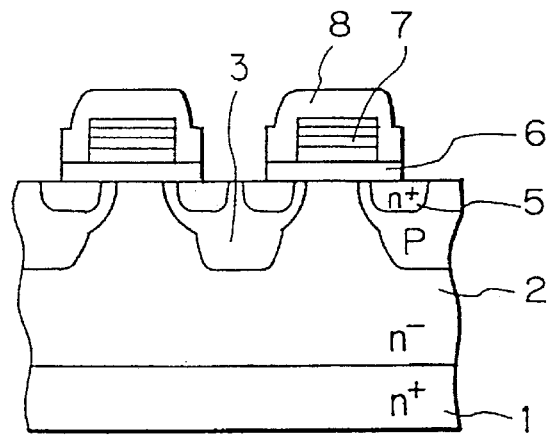
FIGS. 8(a) and 8(b) are sectional views useful for explaining the fabrication process of the first embodiment.
Figure 8B:
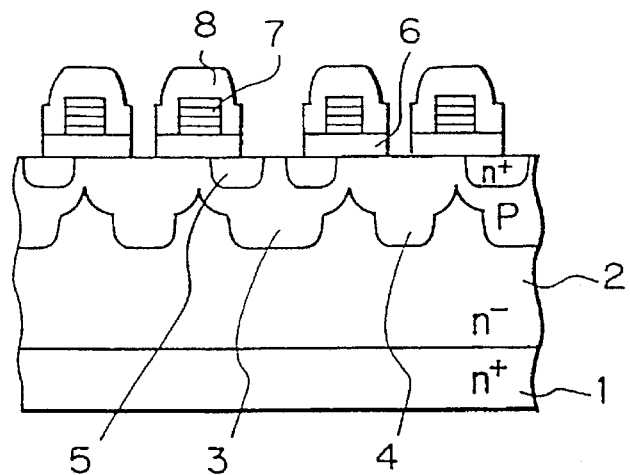
Figure 8C:
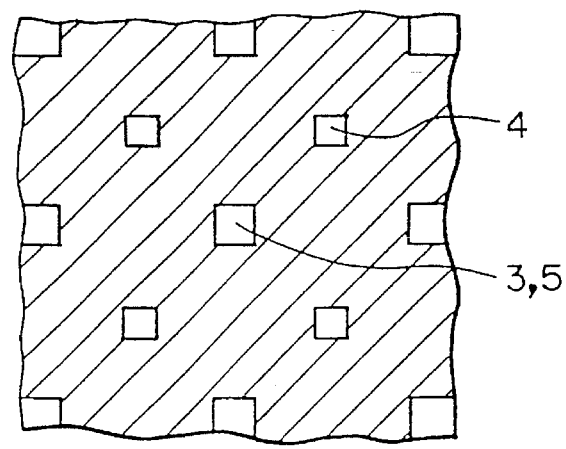
FIG. 8(c) is a planar view showing contact holes through inter-level insulating film.
Figure 9A:
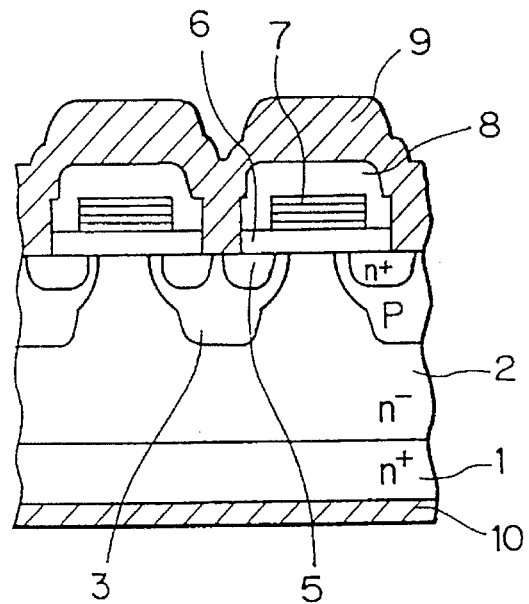
FIGS. 9(a) and 9(b) are sectional views useful for explaining the fabrication process of the first embodiment.
Figure 9B:
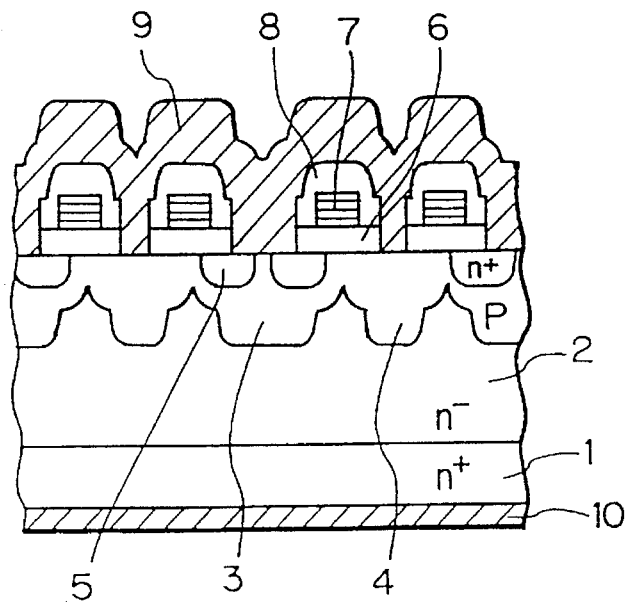

Thereafter, a BPSG film is deposited by CVD to form the inter-level insulating film 8, and contact holes opening to both of the p base layer 3 and the n⁺ source layer 5 and contact holes opening to the p extraction region 4 are bored in the inter-level insulating film 8 as shown in FIG. 8(c) to form a source contact region Z1 and an extraction port contact region Z2 as shown in FIGS. 8(a) and (b). Vacuum deposition of an aluminum film and its patterning are then carried out to form the source electrode 9, a source pad (not shown) and a gate pad (not shown) as shown in FIGS. 9(a) and (b). A Ti/Ni/Au metal film, for example, is vacuum deposited on the back side to form the drain electrode, and the DMOS shown in FIG. 12 is fabricated. Though a passivation film is formed on the source electrode 9, this film is omitted form the drawings.

According to the structure described above, the p base layer 3 is short-circuited to the source electrode 9 through the p extraction region 4 set in the corner direction of the unit cell, that is, in the diagonal direction, at the channel portion Z3 which is set in the proximity of the p base layer 3. Therefore, in the region Z3 in which the potential is most likely to rise in the p base layer in the prior art when a noise current is applied, the potential rise can be suppressed. Furthermore, the p base layers 3 of a plurality of unit cells together form a continuous p-type diffusion region through the extraction regions 4. This arrangement connects the potential of the p base layer of each unit cell to one another, and limits the local potential rise.

As described above, this structure can suppress the npn parasitic transistor operation of each unit cell and even when such an npn transistor operation occurs, the structure can limit it to local operation, and can improve its ability to withstand destruction and increase the maximum current value achievable before latchup phenomena occurs in the IGBT.

The extraction region 4 in the present invention must be disposed between two adjacent unit cells, and a part of this extraction region 4 and a part of the unit cell must be connected to each other. In the present invention, the extraction region 4 preferably is disposed between at least two unit cells that are disposed adjacent to each other in the diagonal direction among a plurality of unit cells.

The shape of the unit cell in the vertical semiconductor device according to the present invention is not limited, in particular, but is preferably square or rectangular and is particularly preferably square.

Accordingly, the extraction region 4 is disposed preferably between at least two unit cells disposed in the diagonal direction.

The planar area of the extraction region in the vertical semiconductor device according to the present invention is set preferably to be smaller than the planar area of the base layer.

According to such a structure, the dead spaces at the corners of the square unit cell, for example, can be utilized effectively. Therefore, even when this extraction region 4 is formed, it is possible to avoid the problem that the gap between the unit cells is expanded substantially or the number of the unit cells is reduced.

Furthermore, it is preferred in the present invention that the diffusion depth of the extraction region 4 be set to be substantially equal to that of the base layer.

When such a structure is employed, the depletion layer that extends from the P-type base towards the n⁺ substrate inside the n⁻ region at the time of turn-off of the semiconductor device extends substantially flatly, and the occurrence of the field effect distribution can be suppressed.

In the vertical semiconductor device according to the present invention, the base region described above may consist of the well region 3a having a high withstand voltage and the shallow channel setting region 3b, and the extraction region may consist of the deep well region which is formed simultaneously with the well region 3a and the connection region which is formed simultaneously with the channel setting region 3b and is connected to the channel setting region 3b.

In the vertical semiconductor device described above, the planar area of the connection region 4b is set preferably to be smaller than the planar area of the channel setting region 3b.

Next, the potential rise suppression effect in the region Z3 in the vertical semiconductor device according to the present invention will be explained on the basis of a simulation result. FIGS. 10(a), 10(b) and 10(c) show the models used for simulation. The model A shown in FIG. 10(a) represents the structure of this embodiment having the extraction layer, the model B shown in FIG. 10(b) represents the structure in which the extraction layer is set independently of the p base layer, and the model C shown in FIG. 10(c) represents the prior art structure. The external electrode of the n⁺ source layer and the external electrode of the p base layer are hereby arranged to be independent so that the value of a current flowing through the n⁺ source layer can be confirmed during the parasitic transistor operation.

Figure 11:
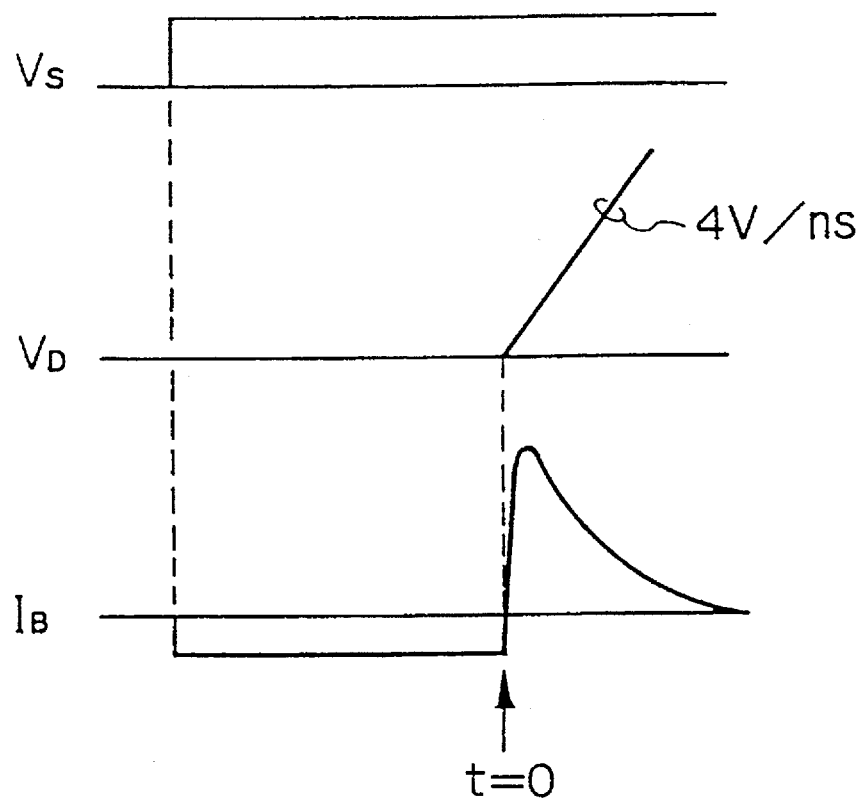
FIG. 11 is a diagram showing a voltage waveform applied to each of the models during the simulation.

FIG. 11 shows an impressed voltage (noise current). First of all, a source electrode voltage Vs is applied constantly to forward bias the PN junction consisting of the p base layer and n⁻ drain layer and to allow the injection of large quantities of positive holes into the drain layer. In this state, the drain electrode voltage Vs is raised at a rate of 4 V/ns. Since the positive holes injected into the drain layer are pulled back to the p base layer in this instance, a large noise current Is flows toward the source electrode. The state at this time is analyzed transiently.

Figure 12A:
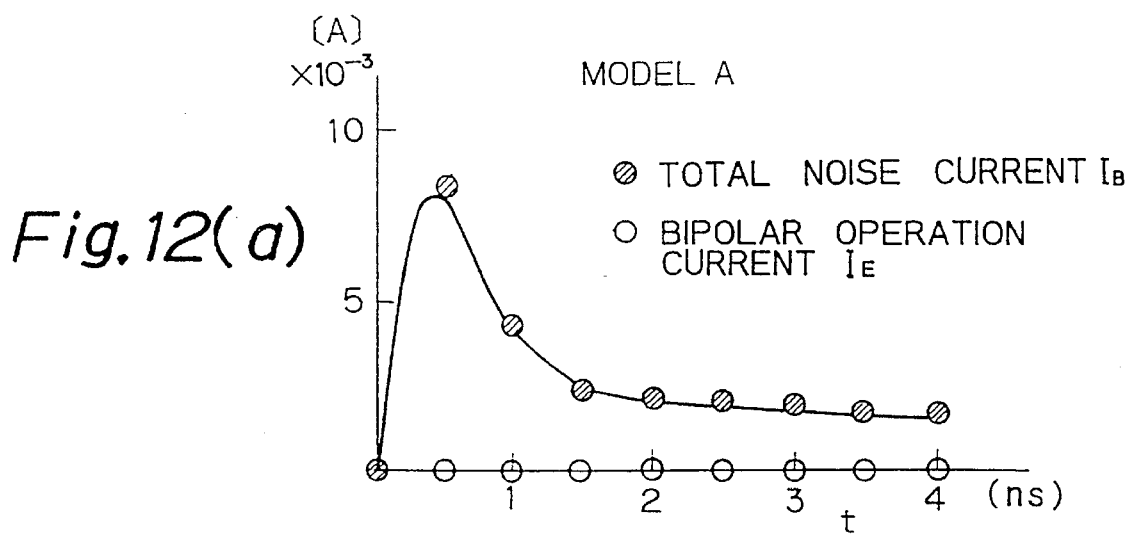
FIGS. 12(a), 12(b) and 12(c) are diagrams showing the result of each model obtained by the simulation.
Figure 12B:
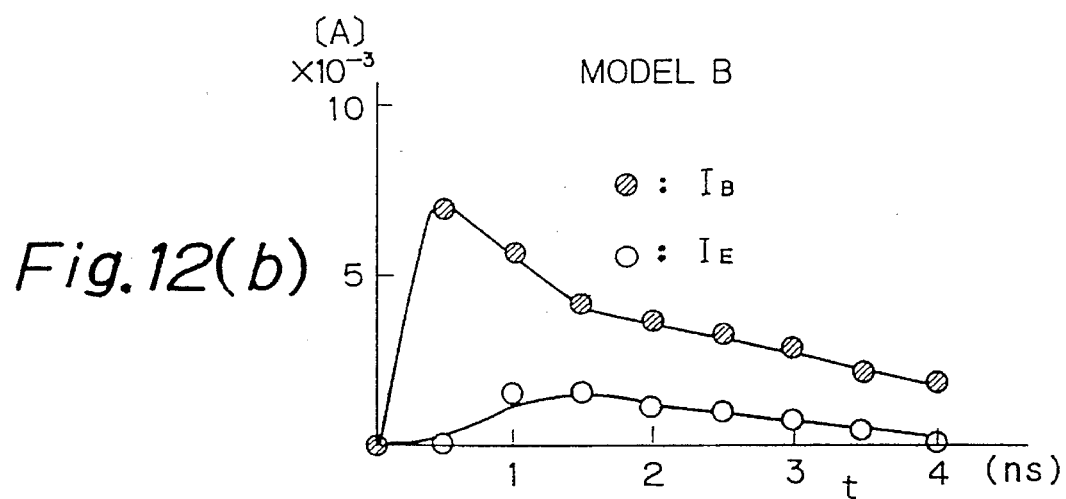
Figure 12C:
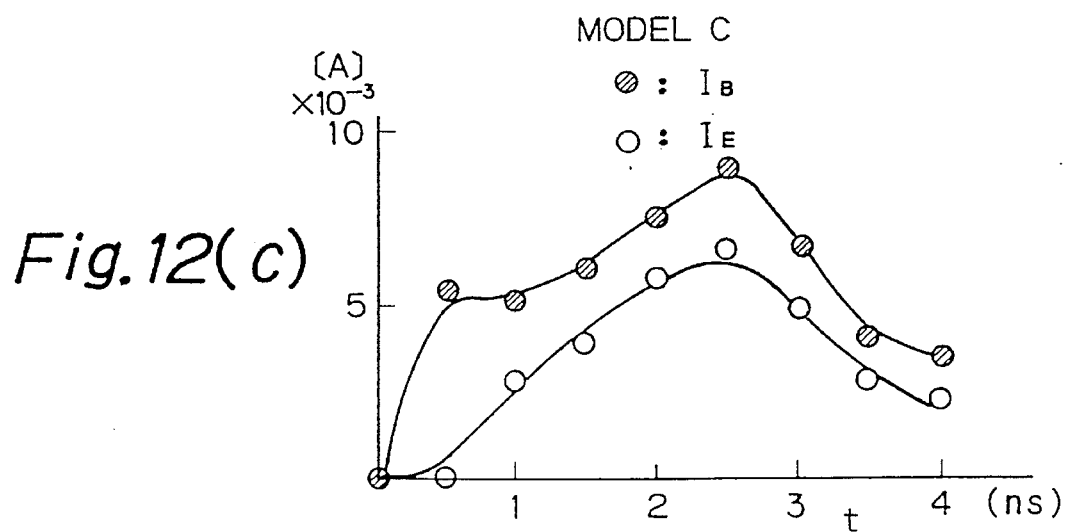
Figure 13A:
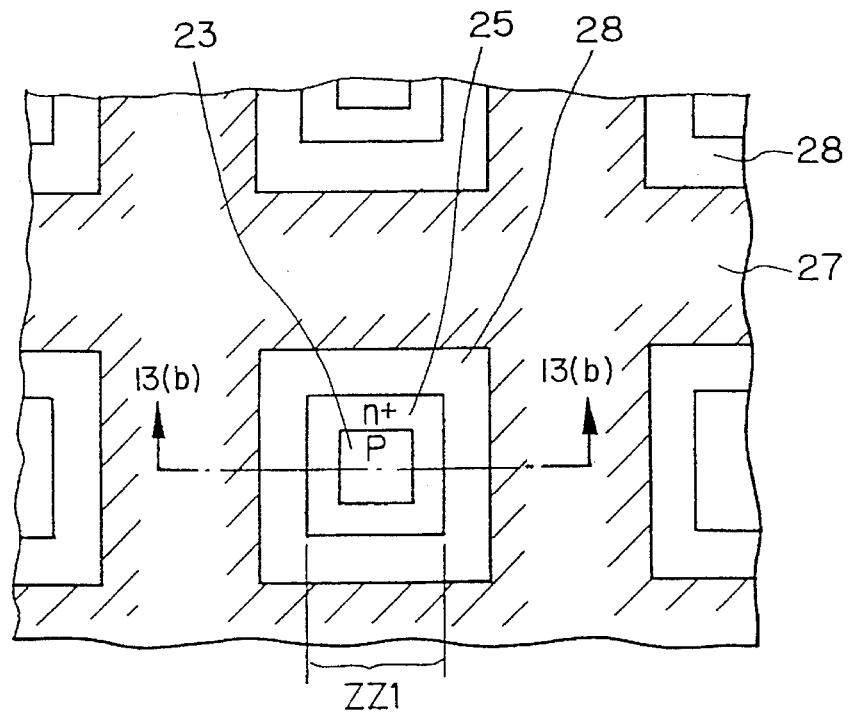
FIG. 13(a) is a plan view showing a surface pattern at the principal portions of a conventional n-channel DMOS transistor.
Figure 13B:
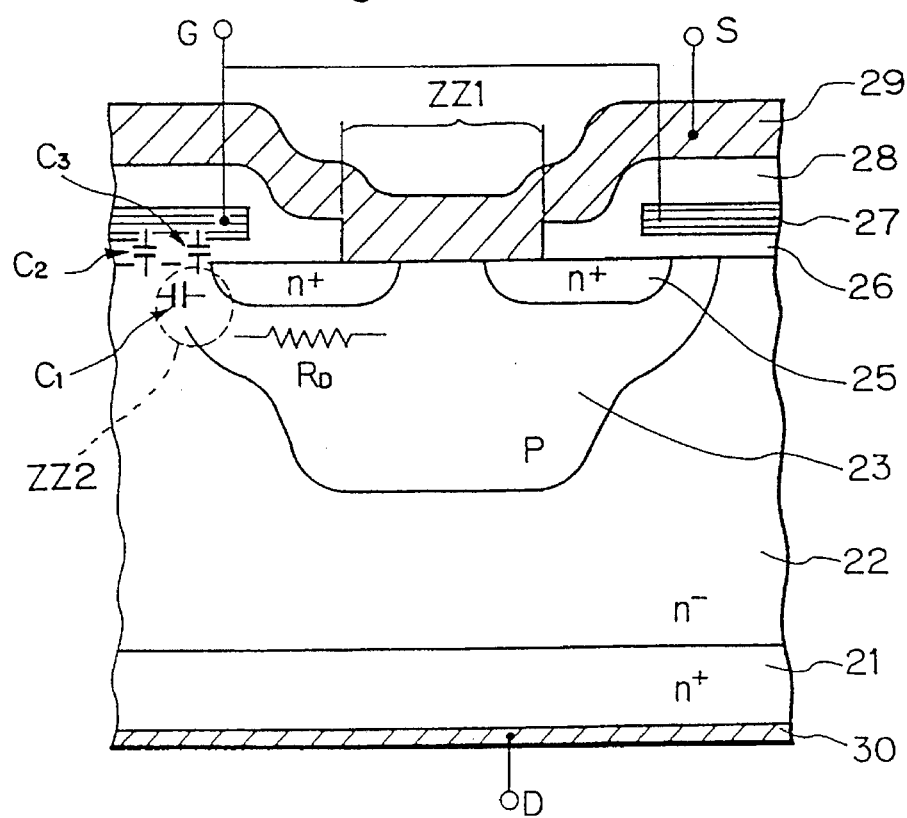
FIG. 13(b) is a sectional view taken along a line 13(b)—13(b) of FIG. 13(a)
Figure 14:
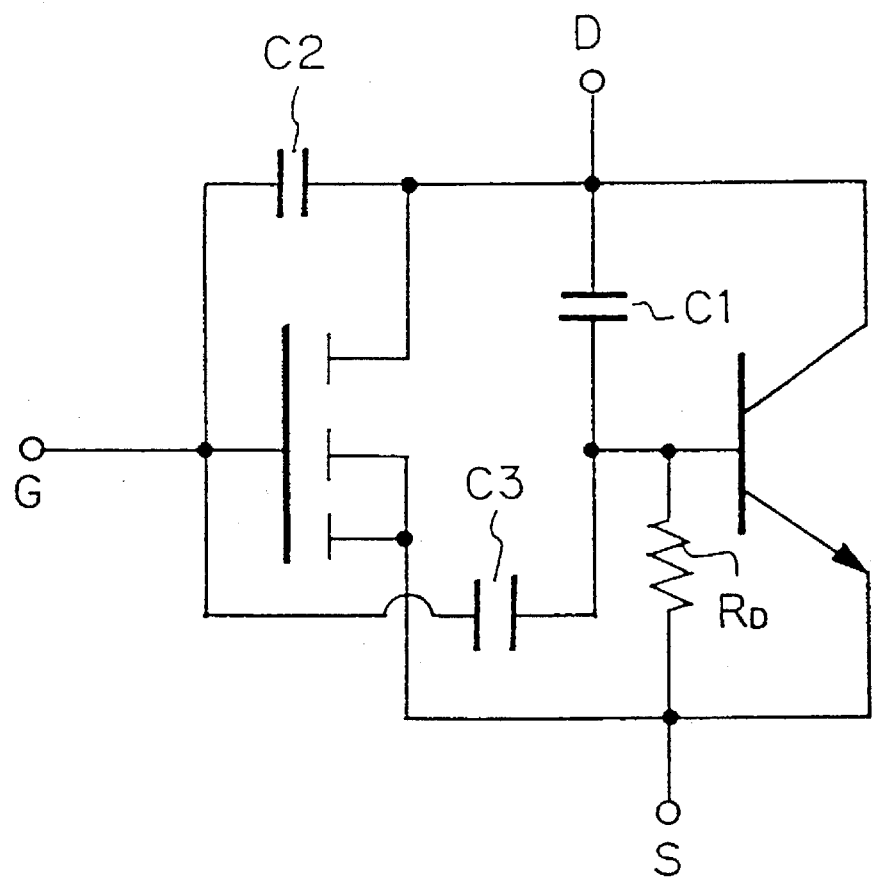
FIG. 14 is an equivalent circuit diagram of the device shown in FIGS. 13(a) and 13(b)
Figure 15A:
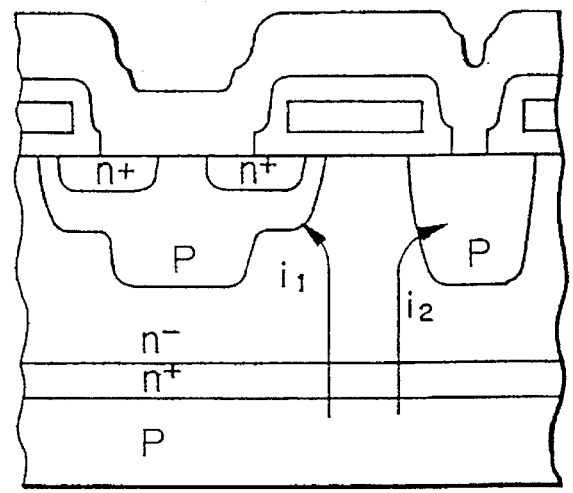
FIG. 15 s a sectional view showing an example of a conventional vertical MOS gate device.
FIG. 15(b) is an equivalent circuit diagram of the vertical MOS gate device shown in FIG. 15(b)
Figure 15B:
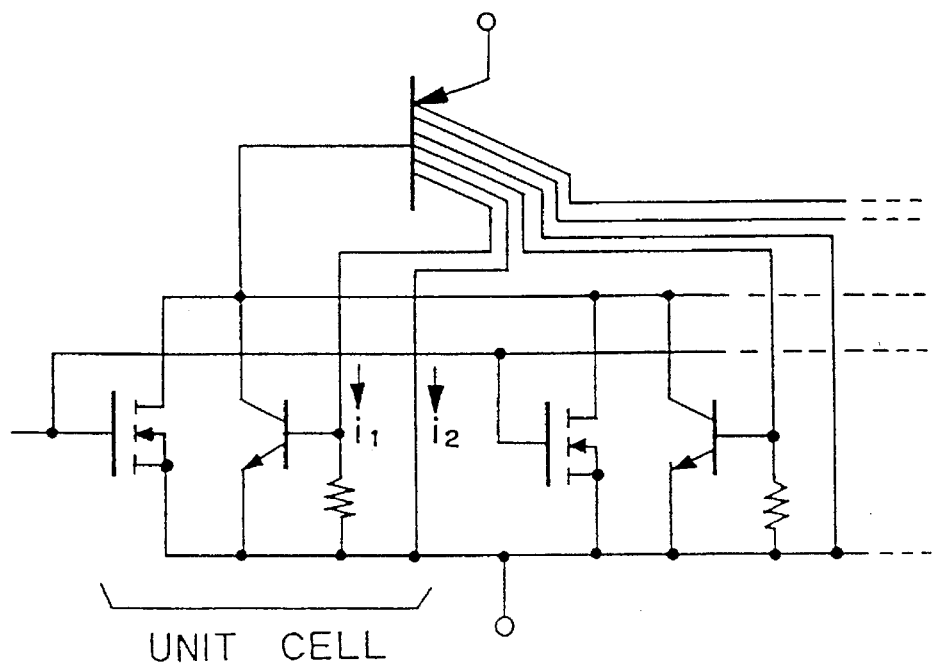
Figure 16:
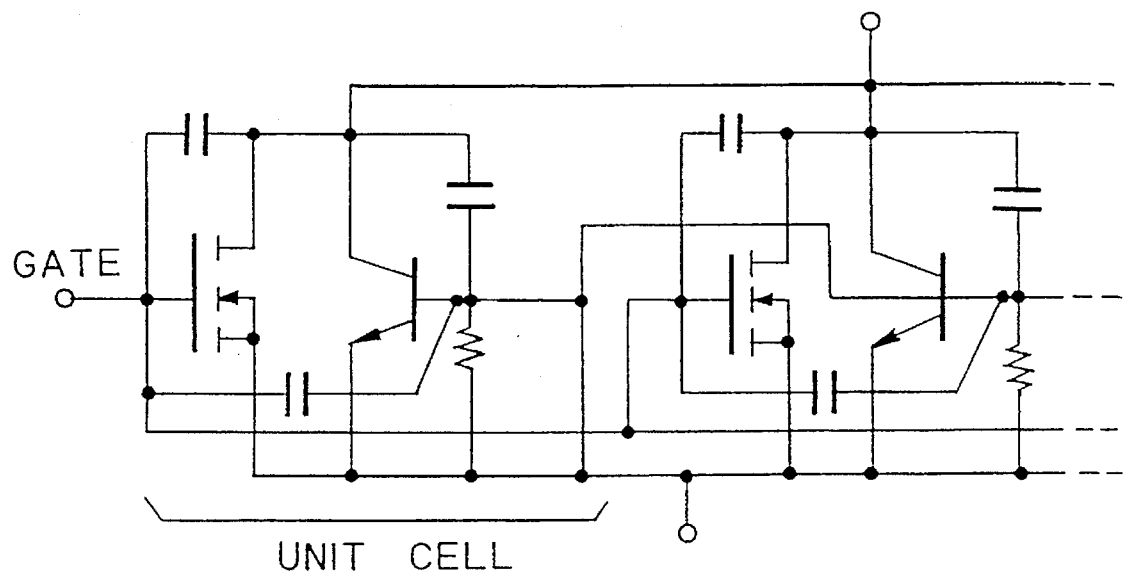
FIG. 16(a) is an equivalent circuit diagram of a vertical MOSFET according to the present invention.
FIG. 16(b) is an equivalent circuit diagram of a vertical insulated gate bipolar transistor (IGBT) according to the present invention.
Figure 16:
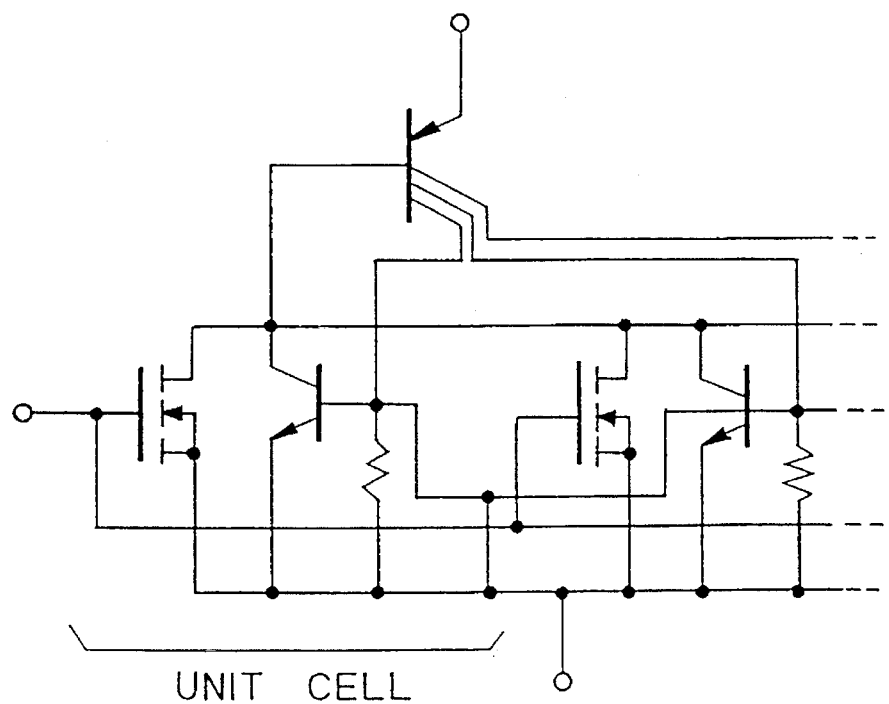

FIGS. 12(a), 12(b) and 12(c) show the result. The drawing shows the change with time of the total noise current $I_B$ and the bipolar operation current $I_E$ flowing through the n⁺ source layer. As shown in FIG. 12(a), in the model A representative of the structure of this embodiment, current flow through the n⁺ source layer cannot be confirmed, and parasitic transistor operation can also not be confirmed. In contrast, as shown in FIGS. 12(b) and 12(c) in the models B and C, the current flow through the n⁺ source layer, and the occurrence of the parasitic transistor operation, can both be confirmed.

It can be understood from the result given above that this embodiment is effective for suppressing the parasitic transistor operation.

When the device is constituted by the use of a plurality of unit cells shown in FIGS. 1 and 2, the local potential rise of the p base layer can be suppressed much more than in the prior art structure having independent p base layers between the unit cells, and the embodiment is effective for suppressing the local parasitic transistor operation because the p base layers form a continuous region through the extraction layers in addition to the higher breakdown voltage of each unit cell described above.

In the explanation given above, the gate electrode is used as the mask for obtaining the continuous p base layer and the p extraction layer and the continuous region is formed by utilizing lateral diffusion at the time of the formation of the p base layer and the extraction layer. However, it is possible to form the p-type continuous region using a mask having a continuous window pattern before the formation of the gate electrode. It is also possible to form the p-type continuous region by removing the gate electrode operating as the mask at the junction between the p base layer and the extraction layer and without using lateral diffusion. In this case, however, an arrangement must be made or the gate electrode in each unit cell will be mutually independent electrically, and electrical connection must then be established using separate wirings, whenever necessary.

In the first embodiment described above, the n⁺ source layer is formed to extend along the periphery of the p base layer, but it is also possible to locally form the n⁺ source layer to leave the surface of the p base layer at the corners, for example. According to this arrangement, another current path extending toward the source contact region can be formed in the p base layer constituting the unit cell, too, and parasitic transistor operation can be further suppressed.

Although an explanation has been given of the n-channel type MOSFET, by way of example, the present invention can be applied similarly not only to the p-channel type MOSFET but also to an IGBT using the a p⁺ silicon substrate and using an n⁺ drain layer for the p⁺ drain layer in the embodiment shown in FIG. 2.

I claim:

1. A vertical semiconductor device comprising:

a semiconductor substrate having a drift region of a first conductivity type disposed on a first main plane side thereof;

a plurality of base layers of a second conductivity type disposed in said drift region, each base layer constituting a unit cell;

a plurality of extraction regions having a same conductivity and impurity concentration as said plurality of base layers disposed in said drift region, said extraction regions being connected to said base layers such that said extraction regions and said base layers define a continuous region;

a gate electrode disposed over portions of said drift region;

a plurality of source layers of said first conductivity type, wherein one of said plurality of source layers is disposed in each of said plurality of base layers such that, in each unit cell, a portion of said base layer located between said source layer and said drift region defines a channel region;

a source electrode electrically connected to said source layer and to said base layer at a first point in each unit cell, said source electrode also directly contacting said extraction region at a contact zone thereof such that a branch current path exists in each unit cell from said channel region to said source electrode through said contact zone in an associated extraction region; and a drain electrode disposed on a second side of said semiconductor substrate.

2. A vertical semiconductor device comprising:

a semiconductor substrate having a drift region of a first conductivity type disposed on a first side thereof;

a plurality of base layers of a second conductivity type disposed in said drift region;

a plurality of source layers of said first conductivity type, wherein one of said plurality of source layers is disposed in each of said base layers such that a portion of said base layer located between said source layer and said drift region defines a channel region, wherein a combination of said base layer and said source layer associated therewith defines a unit cell;

a source electrode electrically connected to said plurality of source layers and to said plurality of base layers;

a drain electrode disposed on a second side of said semiconductor substrate such that first current paths are defined from said drain electrode to said source electrode through said drift region and said channel region in each unit cell; and a plurality of extraction regions having a same conductivity and impurity concentration as said plurality of base layers, said extraction regions being connected to said base layers at a portion of said channel region such that said extraction regions and said base layers define a continuous region, said extraction region directly contacting said source electrode at a contact zone in said extraction region such that a branch current path exists in each unit cell from said channel region to said source electrode through said contact zone.

3. A vertical semiconductor device according to claim 1, wherein each of said extraction regions is disposed between an adjacent pair of said unit cells.

4. A vertical semiconductor device according to claim 1, wherein said unit cell is a rectangular cell, and said extraction region is disposed between an adjacent pair of said unit cells in a diagonal direction of said unit cells.

5. A vertical semiconductor device according to claim 1, wherein a diffusion depth of said extraction region is substantially equal to a diffusion depth of said base layer.

6. A vertical semiconductor device according to claim 4, wherein a diffusion depth of said extraction region is substantially equal to a diffusion depth of said base layer.

7. A vertical semiconductor device according to claim 3, wherein a plane area of said extraction region is smaller than a plane area of said base layer.

8. A vertical semiconductor device according to claim 1, wherein each of said plurality of base regions comprises a first deep well region for setting a withstand voltage and a shallow channel setting region and wherein each of said plurality of extraction regions comprises a second deep well region formed simultaneously with said first deep well region and a connection region being formed simultaneously with said channel setting region and connected to said channel setting region.

9. A vertical semiconductor device according to claim 4, wherein each of said plurality of base regions comprises a first deep well region for setting a withstand voltage and a shallow channel setting region and wherein each of said plurality of extraction regions comprises a second deep well region formed simultaneously with said first deep well region and a connection region being formed simultaneously with said channel setting region and connected to said channel setting region.

10. A vertical semiconductor device according to claim 9, wherein a plane area of said connection region is smaller than a plane area of said channel setting region.

11. A vertical semiconductor device comprising:

a semiconductor substrate having a drift region of a first conductivity type disposed on a first main plane side thereof;

a plurality of base layers of a second conductivity type disposed in said drift region, each base layer constituting a unit cell;

a plurality of extraction regions having a same conductivity and impurity concentration as said plurality of base layers disposed in said drift region, said plurality of extraction regions being connected to said plurality of base layers such that said extraction regions and said base layers define a continuous region;

a gate electrode disposed over portions of said drift region which are devoid of said base layers or said extraction regions a plurality of source layers of said first conductivity type, wherein one of said plurality of source layers is disposed in each of said plurality of base layers such that, in each unit cell, a portion of said base layer located between said source layer and said drift region defines a channel region;

a source electrode electrically connected to said extraction region at a contact zone thereof such that a current which flows into said extraction region is directly extracted to said source electrode without passing through said plurality of base layers; and a drain electrode disposed on a second side of said semiconductor substrate.

12. A vertical semiconductor device comprising:

a semiconductor substrate having a drift region of a first conductivity type disposed on a first main plane side thereof;

a plurality of base layers of a second conductivity type disposed in said drift region, each base layer constituting a unit cell;

a plurality of extraction regions having a same conductivity and impurity concentration as said plurality of base layers disposed in said drift region, said plurality of extraction regions being connected to said plurality of base layers such that said plurality of extraction regions and said plurality of base layers define a continuous region;

a gate electrode disposed over portions of said drift region which are devoid of said base layers or said extraction regions;

a plurality of source layers of said first conductivity type, wherein said plurality of source layers are arranged such that, in each unit cell, a portion of said base layer located between a source layer and said drift region defines a channel region;

a source electrode electrically connected to said source layer and to said base layer at a first point in each unit cell so that a current that flows into said channel region is extracted through each base layer and said first point, said source electrode directly contacting said extraction region at a contact zone thereof such that a current which flows into said extraction region is directly extracted to said source electrode without passing through said plurality of base layers; and a drain electrode disposed on a second side of said semiconductor substrate.

* * * * *